(12) United States Patent
Lambrecht

(10) Patent No.: US 11,984,845 B1
(45) Date of Patent: May 14, 2024

(54) SOLAR COLLECTOR

(71) Applicant: Richard Lambrecht, West Allis, WI (US)

(72) Inventor: Richard Lambrecht, West Allis, WI (US)

( * ) Notice: Subject to any disclaimer, the term of this patent is extended or adjusted under 35 U.S.C. 154(b) by 0 days.

(21) Appl. No.: 18/495,518

(22) Filed: Oct. 26, 2023

(51) Int. Cl.
*H02S 40/22* (2014.01)
*H02S 20/32* (2014.01)

(52) U.S. Cl.
CPC .............. *H02S 40/22* (2014.12); *H02S 20/32* (2014.12)

(58) Field of Classification Search
CPC ....... H01L 31/00–078; Y02E 10/50–60; H02S 20/00–32; H02S 40/20–22
USPC .................................................. 136/243–265
See application file for complete search history.

(56) References Cited

U.S. PATENT DOCUMENTS

| | | | |
|---|---|---|---|
| 4,249,616 A | 2/1981 | Johnson | |
| 4,284,839 A | 8/1981 | Johnson | |
| 4,433,199 A | 2/1984 | Middy | |
| 9,587,858 B2 | 3/2017 | Lambrecht | |
| 10,551,089 B2 | 2/2020 | Hyatt | |
| 10,686,400 B2 | 6/2020 | Angel et al. | |
| 2009/0056704 A1 | 3/2009 | Donati | |
| 2010/0037953 A1 | 2/2010 | Xie | |
| 2011/0079271 A1 | 4/2011 | Dets | |
| 2011/0114078 A1* | 5/2011 | Fargo | F24S 25/50 126/573 |
| 2013/0008487 A1* | 1/2013 | Cheng | F24S 23/12 136/248 |

FOREIGN PATENT DOCUMENTS

| | | |
|---|---|---|
| WO | WO2016/115502 | 7/2016 |
| WO | WO2016/141041 | 9/2016 |
| WO | WO2018/204388 | 11/2018 |

* cited by examiner

*Primary Examiner* — Bach T Dinh
(74) *Attorney, Agent, or Firm* — RYAN KROMHOLZ & MANION, S.C.

(57) ABSTRACT

A light wave (solar) collector apparatus includes a preferably parabolic mirror configured to direct solar energy towards a secondary reflector, then through a gap in the mirror, and towards one or more secondary mirrors, each of the secondary mirrors positioned to direct the solar energy towards a solar collection target. The subsequent diversion achieved by the solar collector apparatus allows collection of solar energy several times denser than natural sunlight, and can be captured using a substantially compact system.

8 Claims, 5 Drawing Sheets

SOLAR COLLECTOR

BACKGROUND OF THE INVENTION

The present invention relates generally to solar energy collecting devices, and more particularly to a solar reflector system for maximizing concentrated solar energy by directing solar energy to a solar collection target.

Solar energy collecting devices have been used for residential and commercial heating and energy production. However, current collecting devices utilize only single axis tracking of the solar path, or provide no solar tracking, therefore resulting in rather inefficient operation throughout the day and the year. Furthermore, many current solar collecting devices make use of a system that creates only a single diversion, and therefore concentrates a limited amount of solar energy to a single point. Finally, solar collector systems used to collect large quantities of solar energy can be extremely large.

SUMMARY OF THE INVENTION

The present invention provides at least one primary mirror (preferably parabolic) configured to direct light waves (solar energy) to a secondary reflector, through a gap in the mirror, towards a set of secondary mirrors, each of the secondary mirrors positioned to direct the solar energy towards a solar collection target.

A system according to the present invention includes a parabolic mirror extending longitudinally along and straddling a central plane. The parabolic mirror is configured to direct received sunlight towards a focal line contained within the central plane. A secondary mirror is positioned along the focal line configured to receive reflected sunlight from the parabolic mirror. At least one secondary mirror (e.g. planar, paraboloid, or parabolic mirror) is adapted to receive directed sunlight from the lens and to reflect the directed sunlight at a target, which may be positioned inside or outside the length of the parabolic mirror.

According to an aspect of a system according to the present invention, the parabolic mirror and lens are preferably positionally fixed with respect to each other. The secondary mirrors are selectively stationarily positionable with respect to the parabolic mirror and/or lens.

According to another aspect of a system according to the present invention, a tracking system may be coupled to the mirror so as to allow the central plane to be generally aimed at the sun throughout the day.

A method according to the present invention includes the steps of reflecting sunlight from a mirror towards a secondary mirror, which then directs the sunlight towards a reflective surface (which may be planar or a paraboloid) having a first reflective area. The sunlight is focused on a target surface area, wherein the target surface area is smaller than the first reflective area.

According to one aspect of a method according to the present invention, the method may further include the step of rotating the parabolic mirror along a first plane of rotation and/or the step of rotating the parabolic mirror along a second plane of rotation (which may be perpendicular to the first). These rotations may be carried out consecutively or partially or completely simultaneously.

Lenses such as a double convex lens or one or more plano-convex rectangular cylindrical lenses, can be positioned anywhere within the system to intensify and/or focus the light waves.

DETAILED DESCRIPTION OF THE INVENTION

Although the disclosure hereof is detailed and exact to enable those skilled in the art to practice the invention, the physical embodiments herein disclosed merely exemplify the invention which may be embodied in other specific structures. Although the specification and claims may refer to solar light, any type of light waves are able to be collected using the apparatus and methods of the present invention. Also, the claims should not be construed to require light waves as a positively recited claim element. While the preferred embodiment has been described, the details may be changed without departing from the invention, which is defined by the claims.

Figure 1:
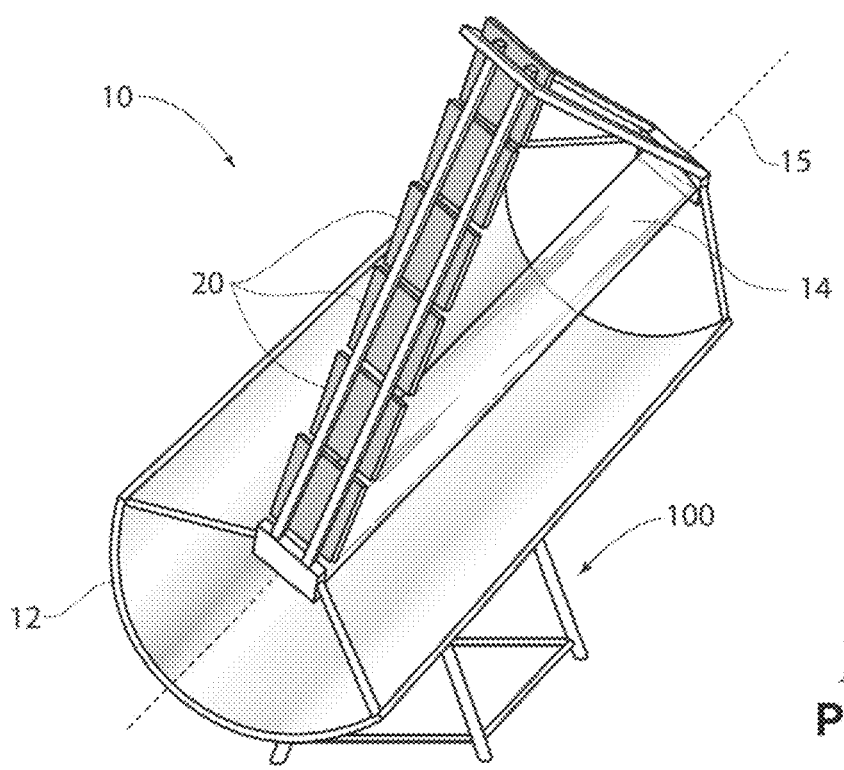
FIG. 1 is a perspective view of a prior art solar collector apparatus.
Figure 2:
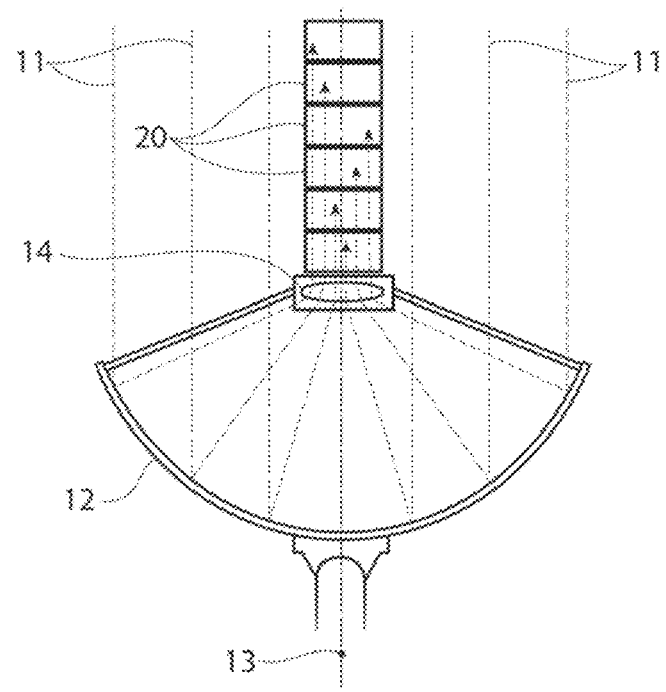
FIG. 2 is an end view of the solar collector apparatus shown in FIG. 1.
Figure 3:
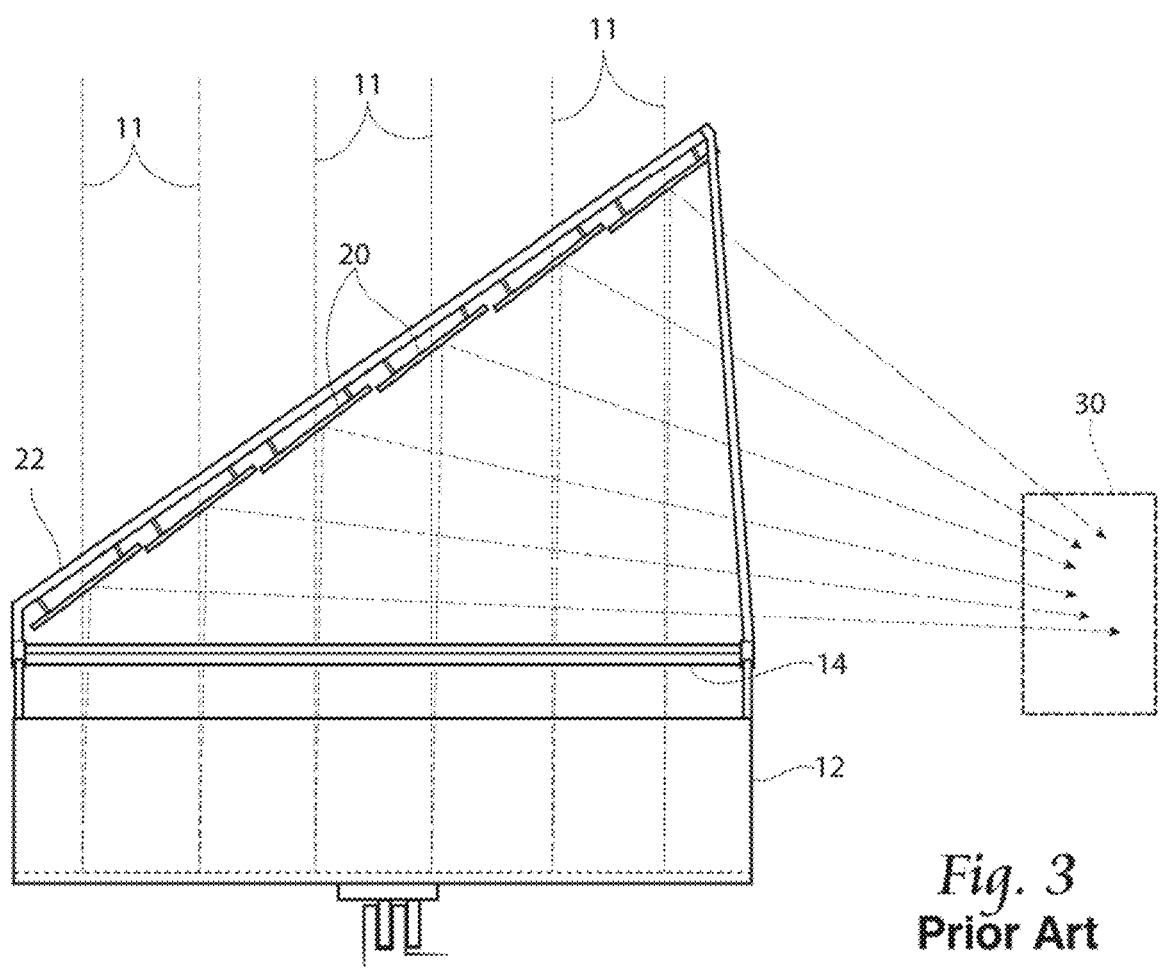
FIG. 3 is a side view of the solar collector apparatus shown in FIG. 1.

FIGS. 1-3 depict a solar collector 10 of the prior art; namely, a solar collector invented by the present inventor as disclosed in U.S. Pat. No. 9,587,858, incorporated by reference. As disclosed therein, the solar collector 10 has a parabolic mirror 12, a double convex lens 14, and a plurality of secondary mirrors 20. The solar collector 10 is held on a base 100 that may utilize a solar tracking system as disclosed in U.S. Pat. No. 9,587,858.

In U.S. Pat. No. 9,587,858, the parabolic mirror 10 is situated in order to receive solar energy and direct it towards double convex lens 14 that is positioned along a central axis 15 of the parabolic mirror 10. The parabolic mirror 10 may be constructed any length and width necessary to collect the desired amount of solar energy. In a preferred embodiment, the parabolic mirror 10 is 5 feet in length and has a width of approximately 6 feet. In a preferred embodiment, the double convex lens 14 has a width of 1 foot and thereby collects solar energy that is directed to the parabolic mirror 10 that is on each side of the lens 14. In an alternative preferred embodiment, the lens 14 has a width of 4-6 inches.

As shown in FIGS. 2 and 3, light rays such as sun rays 11 are received by the parabolic mirror 10 and directed towards the center axis 15 containing central plane 13 where the rays are received by and directed through the double convex lens 14. Through the double convex lens 14, the rays 11 are directed from the lens 14, perpendicular to the center axis 15 and all parallel to one another. In this parallel fashion, the rays 11 are all directed to the plurality of secondary mirrors 20 that are aligned along the center axis 15 and extending at approximately a 45 degree angle from the lens 14. As such, the rays 11 that are directed through the lens 14 along the length of the parabolic mirror 12 are all received by one of the secondary mirrors 20. The secondary mirrors 20 are positioned so as to direct all of the rays 11 that had been directed through the lens 14 towards a solar collection target 30. It is understood that each of the secondary mirrors 20 may need to be independently positioned in order that all of the solar energy is directed by the secondary mirrors 20 to the same target location. The position of the mirrors 20, including the distance above the lens 14 that they are positioned and/or the angle at which the length of mirrors 20 is positioned over the lens 14, may be dependent upon the location of the solar collection target 30, and can be configured accordingly.

The number of secondary mirrors 20 may be dependent upon the amount of solar energy desired or space available for the solar collector 10. Various numbers of secondary mirrors 20 can be used within the scope of the invention. This subsequent diversion by the secondary mirrors 20 allows for far greater collection of solar energy than solar collectors utilizing only a single diversion mechanism.

Figure 4:
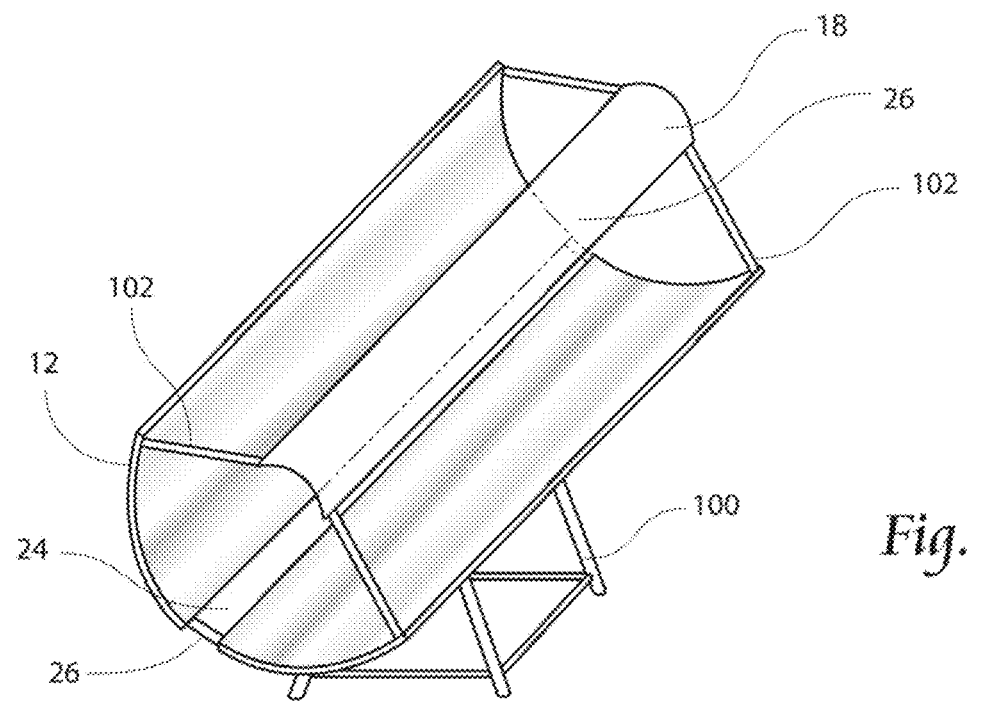
FIG. 4 is a perspective view of a solar collector apparatus of the present invention.

Referring now to FIG. 4, a perspective view of a light wave collector apparatus of the present invention is shown. In this embodiment, a secondary reflector 18 is provided at a focal location of mirror 12 (mirror 12 being preferably parabolic) to collect light rays reflected off of trough-shaped parabolic mirror 12. A gap 24 formed at a base area in the parabolic mirror 12. Alternatively, two halves of mirror 12 are provided spaced apart, and held together by slats 26, to provide gap 24. Frame 100 can be used to support and elements of the light wave collection system.

Preferably, secondary reflector 18 is a concave mirror surface for catching light rays bounced off the trough shaped primary reflector 12, and then reflecting the concentrated light waves downwardly through gap 24, where the concentrated light waves can be further transmitted as discussed below with reference to FIGS. 6 and 7.

Figure 5:
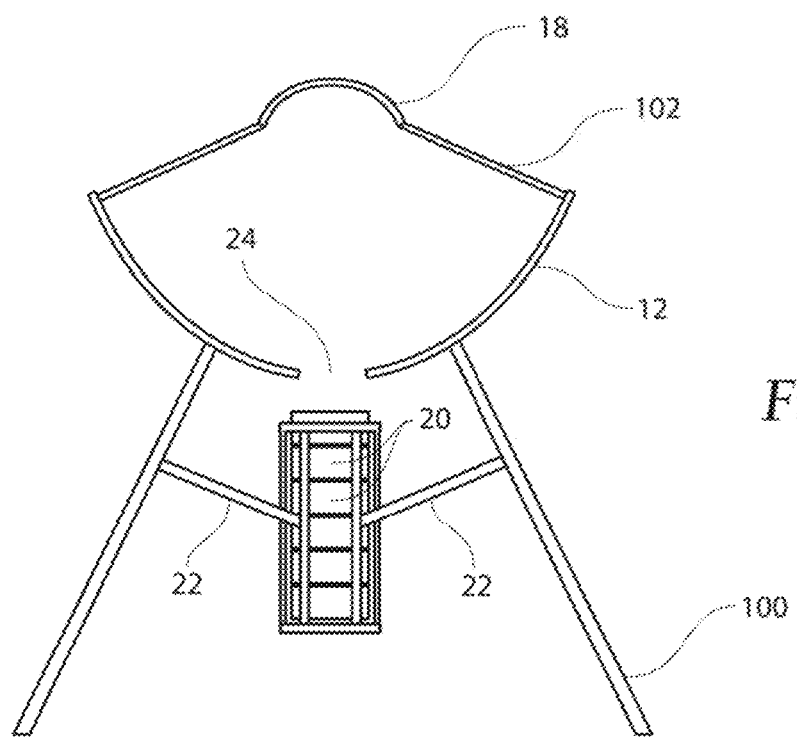
FIG. 5 is a rear side view of the solar collector apparatus shown in FIG. 4.
Figure 6:
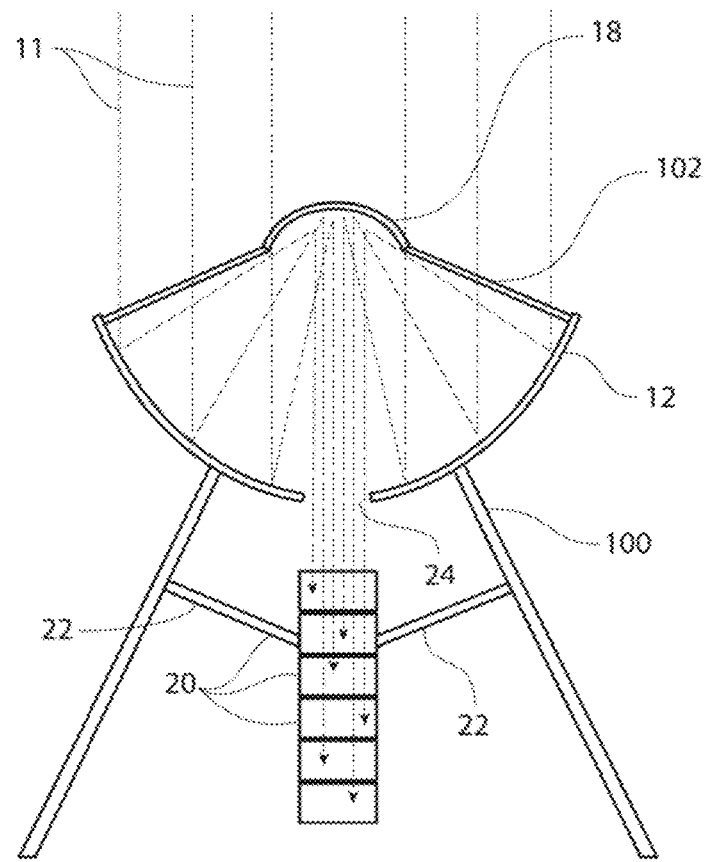
FIG. 6 is a front side view of the solar collector apparatus shown in FIG. 4 reflecting light waves.

Referring now to FIGS. 5 and 6, rear and front end views, respectively, of the light wave collector apparatus. As shown in FIG. 6, the light waves 11 are first reflected off mirror 12, directed relatively upwards towards secondary reflector 18, then reflected off secondary reflector 18 relatively downwards through gap 24, to and off secondary mirrors 20.

In a preferred embodiment and as can be seen in FIG. 5, mirrors 20 are carried by a secondary mirror support system 22 which either can carried by frame 100 (as shown) or suspended under mirror 20 or supported by a ground surface (not shown).

Figure 7:
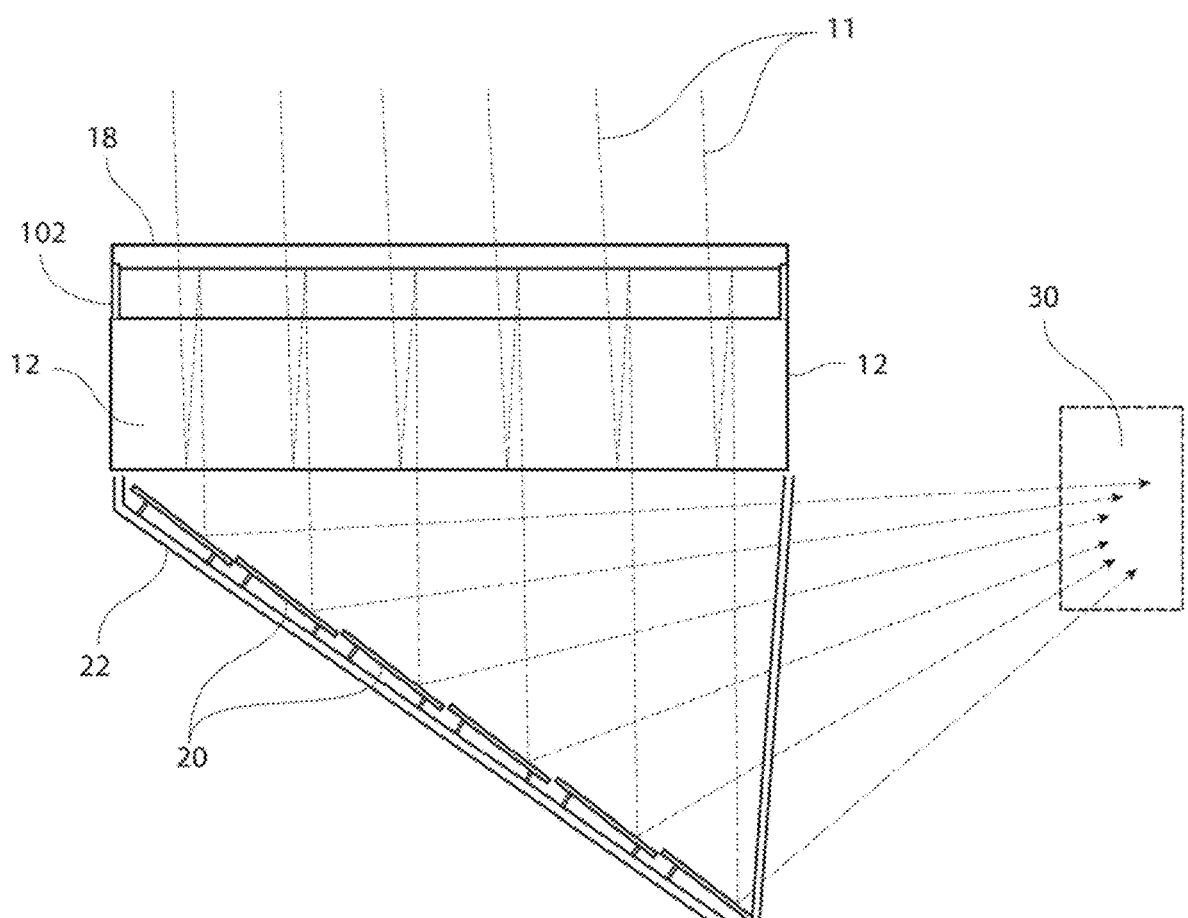
FIG. 7 is a side view of the solar collector apparatus shown in FIG. 4 reflecting light waves.

Referring now to FIG. 7, a side view of the solar collector apparatus shown in FIG. 4 (frame 100 not depicted in FIG. 7) is shown. Light waves 11 are first reflected off mirror 12, directed relatively upwards towards secondary reflector 18, then reflected off secondary reflector 18 relatively downwards through gap 24 (which is not visible from this side view, but is towards the bottom portion of mirror 12, above secondary mirrors 20), to and off secondary mirrors 20, and last directed at target 30.

Figure 8:
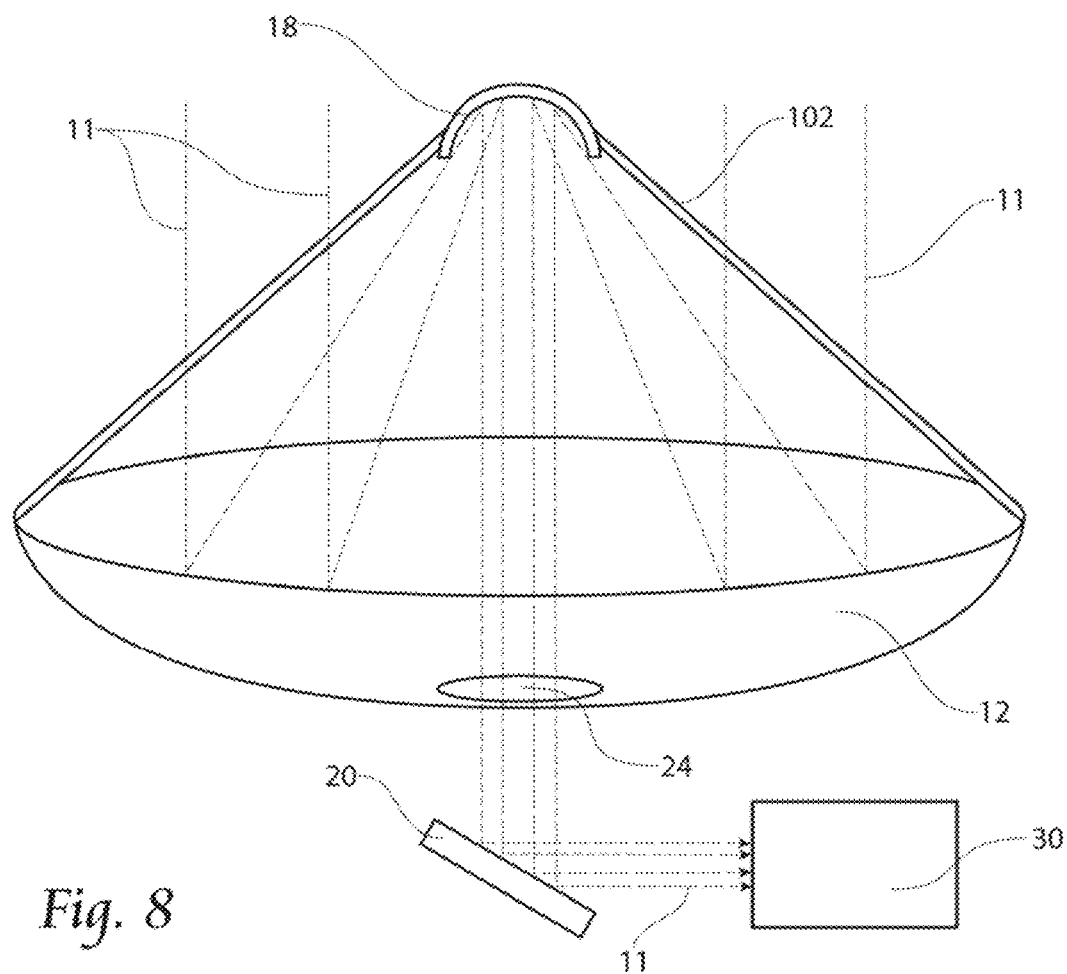
FIG. 8 is a perspective view of an alternate embodiment of a solar collector apparatus of the present invention.

Referring now to FIG. 8, a perspective view of an alternate embodiment of a light wave collector apparatus of the present invention is shown. In this embodiment, mirror 12 comprises a saucer-shaped mirror, which directs light waves 11 to a focal point occupied by secondary reflector 18, which can be cup-shaped. Light waves 11 from secondary reflector 18 are transmitted through gap 24 in mirror 12, to reflection mirror 20 (which can either be flat or concave cup-shaped, and intensified light waves 11 are transmitted to target 30 as previously described. Of course a frame 100 could be used to carry the components shown in FIG. 8 (not shown).

In order to maximize the solar collecting capabilities of the present invention and account for daily movement of the sun and solar altitude, the various components of the system, including the parabolic mirror 12, each of the secondary mirrors 20, and/or the solar collection target(s) 30 are preferably movable, optionally independently, and/or positionable in order to capture the greatest amount of solar energy, as disclosed in U.S. Pat. No. 9,587,858. In this way, the parabolic mirror 12 can be positioned such that the sun rays 11 hit the parabolic mirror 12 substantially parallel to the central plane 13 which maximizes the amount of solar energy collected by the solar collector 10.

The solar energy collected via the solar collector 10 at the solar collection target 30 can be used for any purposes known in the art, such as to heat something (e.g. to provide hot water to a building or home through a solar water heater), or to generate electricity via a photovoltaic cell, or to catalyze hydrogen production via electrolysis.

The foregoing is considered as illustrative only of the principles of the invention. Furthermore, since numerous modifications and changes will readily occur to those skilled in the art, it is not desired to limit the invention to the exact construction and operation shown and described. While the preferred embodiment has been described, the details may be changed without departing from the invention, which is defined by the claims.

The invention claimed is:

1. A light ray collector comprising:
   a parabolic trough mirror comprising a first portion and a second portion separated by a longitudinally extending gap;
   a secondary reflector positioned along a focal line of said parabolic trough mirror to receive light rays directed from said parabolic trough mirror;
   said longitudinally extending gap positioned to allow light rays directed from said parabolic trough mirror to said secondary reflector, and from said secondary reflector, to pass therethrough;
   a series of secondary mirrors positioned to receive light rays from said secondary reflector through said gap, said secondary mirrors positioned to reflect light rays at a target;
   said series of secondary mirrors spaced apart in a longitudinal direction along said longitudinally extending gap from a first end of said parabolic trough mirror to a second end of said parabolic trough mirror;
   a first of said series of secondary mirrors spaced from said longitudinally extending gap a first distance at said first end of said parabolic trough, and a second of said series of secondary mirrors spaced from said longitudinally extending gap a second distance at said second end of said parabolic trough, said first distance greater than said second distance;
   a support frame carrying said first and said second portion of said parabolic trough mirror, said support frame carrying said secondary reflector, and said support frame carrying said secondary mirrors.

2. The solar collector according to claim 1, wherein said secondary mirror is a planar mirror.

3. The solar collector according to claim 1, wherein said secondary mirror comprises a paraboloid.

4. The solar collector according to claim 1, wherein said secondary reflector is carried by said mirror.

5. The solar collector according to claim 1, wherein said secondary mirror is selectively positionable with respect to said mirror.

6. The solar collector according to claim 1, said solar collector further comprising a solar tracking solar collector configured to move said mirror in relation to a position of a source of light rays.

7. The solar collector according to claim 1, said mirror comprising a first parabolic mirror extending longitudinally along and straddling a central plane of said first parabolic mirror.

8. The solar collector according to claim 1, said secondary reflector comprising a second parabolic mirror.

* * * * *